US006628163B2

(12) United States Patent
Dathe et al.

(10) Patent No.: US 6,628,163 B2
(45) Date of Patent: Sep. 30, 2003

(54) CIRCUIT FOR TUNING AN ACTIVE FILTER

(75) Inventors: Lutz Dathe, Dresden (DE); Henry Drescher, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/185,146

(22) Filed: Jun. 27, 2002

(65) Prior Publication Data

US 2003/0090316 A1 May 15, 2003

(30) Foreign Application Priority Data

Nov. 15, 2001 (DE) .......................................... 101 56 027

(51) Int. Cl.$^7$ ............................................... H03B 1/00
(52) U.S. Cl. ...................................................... 327/553
(58) Field of Search ................................ 327/551, 552, 327/553, 554, 558, 559

(56) References Cited

U.S. PATENT DOCUMENTS

| | | | | |
|---|---|---|---|---|
| 4,733,205 A | * | 3/1988 | Hughes | 333/172 |
| 5,245,646 A | * | 9/1993 | Jackson et al. | 377/2 |
| 5,914,633 A | * | 6/1999 | Comino et al. | 327/553 |
| 6,304,135 B1 | * | 10/2001 | Muza | 327/553 |
| 6,452,444 B1 | * | 9/2002 | Mehr | 327/554 |

* cited by examiner

*Primary Examiner*—Jeffrey Zweizig
(74) *Attorney, Agent, or Firm*—Meyertons Hood Kivlin Kowert & Goetzel, P.C.; B. Noël Kivlin

(57) ABSTRACT

A circuit comprises an active filter with linear elements and a tuning circuit with linear elements of the same type as the filter circuit. A backward counter generates a count value that represents a time constant of the tuning circuit. The initial value of the backward counter contains information concerning the relationship between the time constant of the filter circuit and the tuning circuit. A decoder creates a digital code responsive to the count value which is used to switch an array of linear elements in order to tune the time constant of the filter to approximately a desired design value.

30 Claims, 1 Drawing Sheet

CIRCUIT FOR TUNING AN ACTIVE FILTER

BACKGROUND OF THE INVENTION

1. Field of the Invention

The present invention relates to an electronic circuit for tuning an active filter, more specifically to a circuit having an array of switched linear electronic elements such as capacitors, which defines a time constant (e.g., an RC time constant), wherein the array is switched according to a digital code supplied to the array to adjust the total capacitance of the array to approximately a desired design value to maintain the time constant within a defined range.

2. Background of the Invention

In the field of electronics active filter elements are widely used and, hence, such filter elements are increasingly produced as mass products in the form of integrated circuits. Active filters including resistors and capacitors are particularly subject to an integration process due to the possibility of easily incorporating passive linear elements, such as resistors and capacitors, into a manufacturing process for integrated circuits. In low to medium frequency applications (few Hz to several hundred kHz) the amplifiers used in active RC filters can be considered "ideal" amplifiers, i.e., they have infinite gain and zero input current, so that the characteristics of the filter are substantially determined by the RC feedback network of the amplifier. Unavoidable variations of parameters in the manufacturing process and variations during operation of integrated active filters, however, result in deviations of the actual value of individual elements compared to their design value up to ±30%. It is therefore not unusual for integrated circuits to exhibit RC time constants that differ by 50% from their design value. Accordingly, the frequency response of such filters differs in the same magnitude and, thus, clearly restricts the possible applications of these filters, since the designer has to take account of the wide range of variations.

One conventional solution to this problem has been to use integrated active filter circuits in combination with external high precision resistors and capacitors to compensate for the above-mentioned variations. This solution, however, partially offsets the advantages offered by integrated circuits, such as low cost and small size of the filter circuit.

Accordingly, fully integrated active filters have been provided that have a tunable RC time constant to compensate for variations in the manufacturing process and the operating conditions of the filter, such as temperature and supply voltage variations. One way to achieve a tunable RC time constant is to provide "active" resistors, i.e., resistors fabricated as MOSFETs instead of passive resistor elements, and control the MOSFETs to provide a required resistance. In such an arrangement, a feedback circuit measures the actual RC time constant of the filter with reference to, for example, a clock frequency, and provides a corresponding signal to the MOSFETs to continuously adjust their resistance to attain the required time constant. This solution, however, necessitates a continuous input signal for the MOSFETs and thus increases power consumption of the filter circuit. Moreover, this approach is disadvantageous when a low supply voltage is used, for example, as low as about 1 V, since the MOSFETs typically require a threshold voltage of about 1 V to become conducting and, hence, the MOSFETs cannot provide a sufficient variable control range to compensate for the large variations of the active filter.

An alternative approach is to produce tunable filters comprising linear resistors instead of MOSFET resistors, and a tunable array of capacitors. This is proposed by A. M. Durham, J. B. Hughes and W. Redman-White in "Circuit Architectures for High Linearity Monolithic Continuous Time Filters", IEEE Transactions on Circuits and Systems—II: Analog and Digital Signal Processing, Vol. 39, No. 9, September 1992, pp. 651—57. According to this technique the RC time constant of the filter is measured and compared with the nominal design value. The number of active capacitors in the array, that is, the number of capacitors actually connected to the RC network of the filter amplifier, is adjusted to keep the filter circuit within a desired RC range. Due to the employment of passive resistors instead of MOSFET elements, the filter is highly linear. Moreover, the RC time constant of the filter is determined by a digital code supplied to the array that may conveniently be stored in a latch once the digital code has been established. Although the accuracy of the RC time constant is limited by the available number of switchable capacitors in the array, and, hence, by the number of bits of the digital code, a range of ±5% to ±10% for the corner frequency of the filter is sufficient for many low to medium frequency applications so that the filters can be tuned with a relatively low number of capacitors in the array.

Typically, the RC time constant of the filter is determined by generating a pulse signal having a pulse length that represents the time constant of the filter to be tuned. Thereafter the pulse signal is compared to the nominal design value and converted into a digital code to adjust the RC time constant approximately to the design value. These tuning circuits, however, are often complex and power consuming and therefore leave place for improvements.

In view of the above problems, a need exists for an improved and efficient circuit for tuning an active filter.

SUMMARY OF THE INVENTION

According to one embodiment, a circuit includes an active filter having a plurality of first linear electronic elements arranged as a switchable array and at least one second linear electronic element, the first linear electronic elements having an electrical characteristic represented by a first design value and the second linear electronic element having an electrical characteristic represented by a second design value, the first and second linear electronic elements substantially determining a time constant of the active filter. The circuit further includes a tuning circuit for outputting a digital code n to the array of first linear electronic elements to adjust the time constant of the active filter to approximately a predefined value. The tuning circuit comprises a first linear tuning element having an electrical characteristic represented by the first design value times a first predefined factor $K_c$, and a second linear tuning element having an electrical characteristic represented by the second design value times a second predefined factor $K_R$. Moreover, the tuning circuit comprises a signal generator configured to generate a signal indicative of a time constant determined by the first and second linear tuning elements, a backward counter having a reset input for setting the backward counter to an initial value $x_{max}$ in response to a reset signal, a clock input connected to receive a clock signal, an enable input connected to the signal generator to receive a pulse signal for starting the counter with the initial value $x_{max}$ and stopping the counter at the end of the pulse length to generate a count value $x_n$, and a count output for providing the count value $x_n$. Additionally, the tuning circuit comprises a decoder for converting the count value $x_n$ into a digital code n for switching the array of first linear electronic elements.

According to a further embodiment a circuit includes an active filter having a plurality of first linear electronic elements at least some of which are arranged as a switchable array and a second linear electronic element, wherein each of the first linear electronic elements corresponds to a first design value and the second linear electronic element corresponds to a second design value, whereby the first and second linear electronic elements substantially determining a time constant of the active filter. The circuit further comprises a first linear tuning element having an electrical characteristic determined by the first design value and a second linear tuning element having an electrical characteristic determined by the second design value, wherein the first and second tuning element define a tuning time constant. Additionally, the circuit includes means for generating a signal indicative of the tuning time constant, means for providing an output count value on the basis of an initial count value representing a relationship between the time constant and the tuning time constant; and means for providing a digital code to the switchable array on the basis of the output count value in order to adjust the time constant.

In a further embodiment a method of tuning an active filter is provided. The active filter comprises a plurality of first linear electronic elements at least some of which are arranged as a switchable array, and a second linear electronic element, each of the first linear electronic elements corresponding to a first design value and the second linear electronic element corresponding to a second design value, wherein the first and second linear electronic elements substantially determining a time constant of the active filter. The method comprises generating a signal indicative of a tuning time constant defined by a first linear tuning element and a second linear tuning element, wherein an electrical characteristic of the first linear tuning element is determined by the first design value, and an electrical characteristic of the second linear tuning element is determined by the second design value. Moreover, the method includes starting and stopping, on the basis of said signal, a counter operated at a clock frequency to generate a count value, wherein an initial count value of the counter is determined by the time constant and the tuning time constant.

BRIEF DESCRIPTION OF THE DRAWINGS

Further advantages, objects and embodiments of the present invention are defined in the appended claims and will become more apparent with the following detailed description when taken with reference to the accompanying drawing in which:

DETAILED DESCRIPTION

Figure 1:
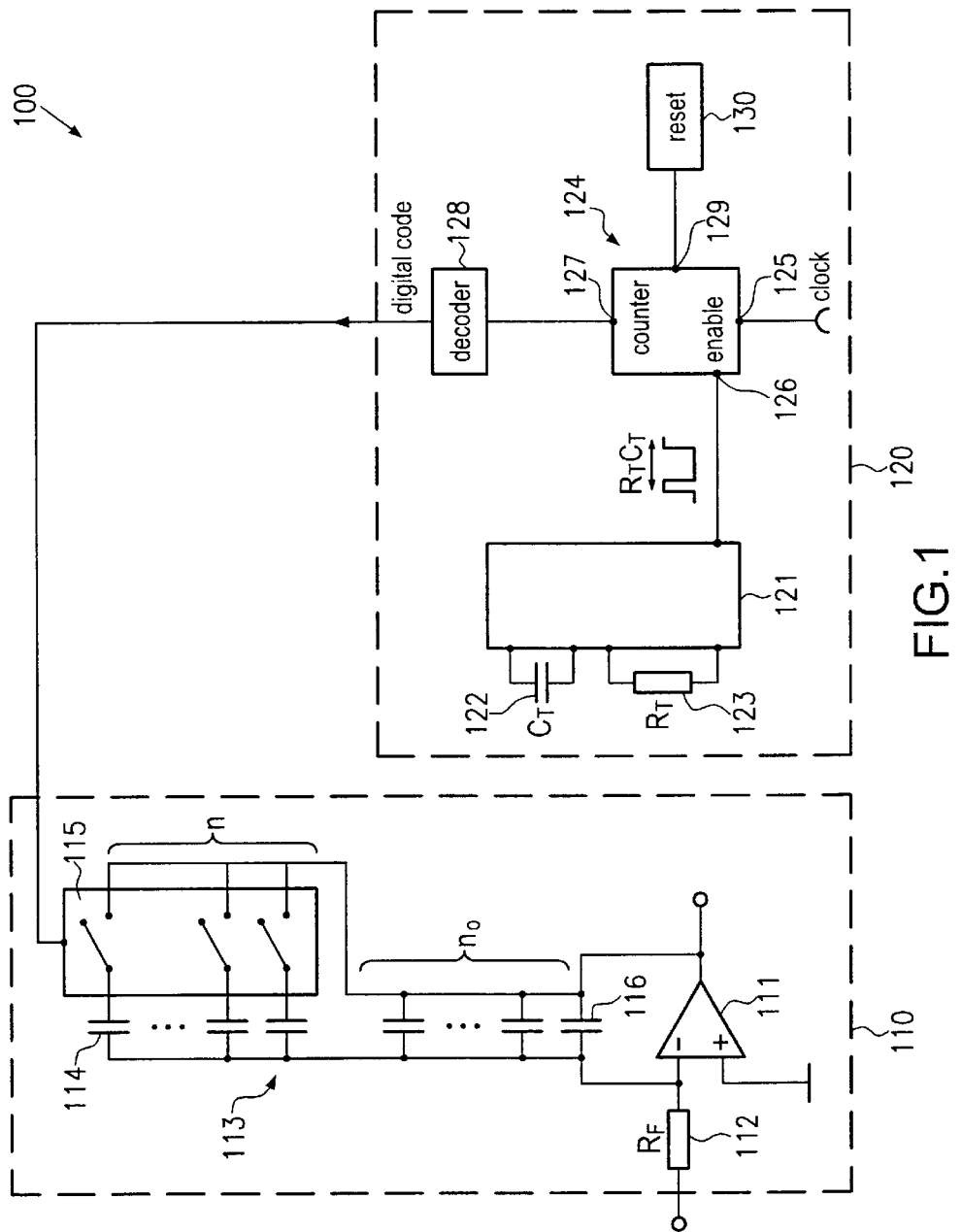
FIG. 1 is a schematic circuit diagram illustrating one embodiment of the present invention.

While the present invention is described with reference to the embodiments as illustrated in the following detailed description as well as in the drawing, it should be understood that the following detailed description as well as the drawing are not intended to limit the present invention to the particular embodiments disclosed, but rather the described embodiments merely exemplify the various aspects of the present invention, the scope of which is defined by the appended claims.

In general, a signal generator is contemplated which is configured to produce a signal corresponding to a time constant of a tuning circuit. In one embodiment the time constant may be represented by two subsequent rising edges of two pulse signals. In a further embodiment, the time constant is represented by a rising edge and a falling edge of a pulse signal. In one particular embodiment, the signal generator may comprise a comparator means as described in a co-pending application filed by the same assignee at the same date as the present application, in which offset and timing errors due to comparator errors are minimized. The pulse length representing the time constant may then be converted into a counter value $x_n$ by a backward counter, wherein the initial value $x_{max}$ at the start of a counting operation of the backward counter contains information relating the filter values to be tuned to the corresponding values of linear elements of the tuning circuit and to a clock frequency with which the counter is operated. Thus, the initial count value $x_{max}$ describes the relationship between the time constant of the filter circuit and the tuning circuit such that the time constant may be indirectly determined by measuring the time constant of the tuning circuit. A digital code n is then a simple function of the counter value $x_n$ and the initial counter value $x_{max}$, which, in one embodiment, may be implemented in a decoder.

FIG. 1 schematically shows one embodiment of a circuit 100 In FIG. 1, the circuit 100 comprises an active filter circuit 110 and a tuning circuit 120. In the embodiment shown, the active filter circuit 110 is implemented as an integrator and includes a filter amplifier 111, hereinafter referred to as an op-amp, with a passive linear electronic element, in the present case a resistor 112, connected with one terminal to the inverting input of the op-amp 111 and with the other terminal connected to receive an input signal. The non-inverting input of the op-amp 111 is connected to a reference potential, such as ground potential. The op-amp 111 may be considered as an ideal op-amp having an infinite gain and a negligible input current within a frequency range of interest, i.e., from DC to several hundred kHz. The output of the op-amp 111 is connected to one terminal of an array 113 of linear electronic elements, comprising n switchable unit capacitors 114 and no permanently connected unit capacitors 116 . Another terminal of the array 113 is connected to a switch 115 to selectively connect one or more of the unit capacitors 114 to the op-amp 111 so as to establish a variable capacitor feedback network.

In an illustrative embodiment, a resistor (not shown) is provided in parallel with the array 113 to establish a low pass filter for improving stability of the filter circuit 100 in the frequency range of interest.

The tuning circuit 120 comprises a signal generator 121 configured to output a signal representing the time constant, for example by the pulse length of a pulse signal or by the rising edges of two subsequent pulses included in the signal. Tuning circuit 120 also includes inputs to which are connected a first linear tuning element, such as capacitor 122, and a second linear tuning element, such as resistor 123. A backward counter 124 having a clock input 125 for receiving a clock signal, an enable input 126, a reset input 129 and a count output 127 is connected, with its enable input 126, to the output of the signal generator 121. A reset means 130 is connected to the reset input 129 of the backward counter 124. The tuning circuit 120 further comprises a decoder 128 having an input connected to the count output 127 of the backward counter 124, and a digital output connected to a switch 115.

In operation, the signal generator 121 creates pulses having an interval between two subsequent rising edges that is substantially equal to a time constant determined by the first and second linear tuning elements, which are represented in the embodiment depicted in FIG. 1 by the capacitor 122 and the resistor 123. The capacitor 122 has a capacitance $C_T$ and the resistor 123 has a resistance $R_T$ so that the time constant of the tuning circuit 120 is given by $R_T C_T$. On the other hand, the time constant of the filter circuit 100 is determined by the resistance $R_F$ of the resistor 112 and the total capacitance $C_F$ of the array 113. The array 113 is comprised of the permanently connected unit capacitors 116 and the switchable capacitors 114 having a capacitance $C_U$, respectively, so that the capacitance $C_F$ of the array 113 can also be written as: $C_F = (n+n_0) C_U$, where $n+n_0$ is the total number of capacitors 116 and 114 that are actually connected to the op-amp 111 by the switch 115. In the embodiment depicted in FIG. 1 the array 115 contains $(2_N-1)$ switchable capacitors 114, but it will readily be appreciated that any suitable number of unit capacitors may be used, depending on the minimum "resolution" of the array 115 and the required range for adjusting variations of the filter capacitance $C_F$.

In one illustrative embodiment (not shown), all capacitors in the array 113 may be switchable.

The frequency dependent response $V_{out}$ of the filter circuit 100 is then proportional to the inverse of the time constant: $V_{out}$ 1/ $R_F C_F = 1/R_F C_U$ $(n_0+n)$. Similarly, when a filter circuit other than the integrator 100 shown in FIG. 1 is to be tuned, the corner frequency $f_c$ of this filter is given by:

$$f_c = \frac{K}{2\pi R_F C_U (n_0 + n)},$$

where K is a filter coefficient of the respective filter type. A deviation of the actual time constant of the filter circuit 100 from the nominal design value $R_F C_F$ due to variations in the manufacturing process and/or variations in the operation conditions of the circuit 100, such as a varying temperature, can substantially be compensated for by connecting or de-connecting one or more additional unit capacitors 114 in the array 113. Preferably, the number of unit capacitors 114 to achieve the nominal design value $C_F$ is selected such that a required range for compensation of variations is obtained. In the embodiment depicted in FIG. 1, the number of connected unit capacitors 114 for attaining the design value $C_F$ is indicated as $n_c$ and is selected to be $n_c=6$. With this value a compensation range of +46% to −32% is available. Any other range, however, may be selected in conformity with the application for which the active filter circuit 100 is used.

The frequency response of the filter circuit 100 due to a variation $\Delta\tau$ of the time constant $\Delta\tau = \tau_F/\tau_0$, with $\tau_F$ as the actual time constant of the filter circuit 100 and $\tau_o$ as the nominal design time constant, may be kept substantially constant, i.e., may be maintained within a range that depends on the number of available unit capacitors 114 and the capacitance $C_U$ (as previously explained, a variation of 5% to 10% is tolerable for many applications), by connecting or de-connecting an appropriate number n of unit capacitors 114 in the array 113. Thus, the frequency response is substantially constant (in the above-explained meaning) for $(n_0+n) \Delta\tau = n_0 +n_c$. The variation $\Delta\tau$ of the time constant that may be compensated for is then given by:

$$\Delta\tau = \frac{n_0 + n_c}{n_0 + n} \quad (1)$$

As can be seen, the variation that can be compensated for is maximal for n=0. The maximum variation $\Delta\tau_{max}$ is given by:

$$\Delta\tau_{max} = \frac{n_c + n_0}{n_0}, \quad (2)$$

for n=0; as explained above, $n_c$ denotes the number of variably connected capacitors 114 necessary to reach the nominal design value. As previously described, this number is set in accordance with the required compensation range. In the present example $n_c=6$.

Tuning of the filter capacitance $C_F$ may require the measurement of the actual filter time constant or at least the measurement of a time constant that is related to the filter time constant. The filter time constant may therefore be directly measured by connecting the resistor 112 and the array 113 to the signal generator 121 by a switching means (not shown). One embodiment may provide a large tuning capacitor 122 and additionally a large tuning resistor 123 to achieve a large time constant of the tuning circuit 120 so that the offset and timing error of the signal generator 121 are small compared to the time constant of the tuning circuit 120 to be measured. To this end, the capacitance $C_T$ and the resistance $R_T$ of the tuning capacitor 122 and of the tuning resistor 123, respectively, may be related to the filter capacitance $C_F$ and $R_F$. This may be accomplished in that the tuning capacitor 122 and the tuning resistor 123 are produced substantially at the same time as the filter capacitors 116 and the filter resistor 112, i.e., the tuning capacitor 122 and resistor 123 have "experienced" substantially the same manufacturing processes. Since the tuning elements in the present embodiment are selected to use a larger number of unit elements or be larger than the corresponding filter elements, the different sizes of the filter and the tuning elements may then be expressed by respective weighting factors $K_R$ and $K_C$ for the tuning resistor 123 and the tuning capacitor 122, respectively: $C_T = K_C C_U \Delta C$; $R_T = K_R R_F \Delta R$, where $\Delta C$ and $\Delta R$ represent a normalized variation of the filter capacitor and the filter resistor, respectively. Preferably, the weighting factors $K_C$ and $K_R$ are integer values to achieve a high degree of conformity of the filter circuit and the tuning circuit. This may be attained by manufacturing the tuning elements as multiples of the corresponding filter unit capacitor 114 and 116 and resistor 112, respectively. Consequently, the time constant of the tuning circuit 120 to be measured, including the variation $\Delta\tau$ due to varied process and/or operating conditions, can be expressed by:

$$t_{RC} = R_T C_T = \Delta\tau K_R K_C R_F C_U \quad (3)$$

It should be noted that the weighting factors are equal to one when the tuning elements have the same size as the filter elements, or when the filter elements are used as the tuning elements.

Again referring to FIG. 1, the signal generator 121 generates a pulse signal having a pulse length that corresponds to the time constant $t_{RC}$ of the tuning circuit 120. The signal generator 121 may comprise an integrator (not shown) and a window comparator (not shown) connected to two reference voltages to provide a pulse signal when the integrator voltage is between the two reference voltages. In one particular embodiment, an integrator and a comparator, performing a single slope measurement as described in the co-pending application submitted by the same assignee, may be used to minimize timing and offset errors of the signal generator 121. It is to be understood, however, that any other appropriate signal generator including, for example, a dual slope measurement means and/or a current mirror, and the like, may be used in accordance with the present invention. The pulse signal is delivered to the enable input 126 of the backward counter 124 to start operation of the backward counter 124. A clock signal with a frequency of, for example, 35.328 MHz is input into the backward counter 124 via the clock input 125. Prior to the delivery of the pulse signal the backward counter may be reset to the initial counter value $x_{max}$ by providing a reset signal output from the reset means 130. The reset means may be triggered by an external source (not shown) and/or by an internal source (not shown) to initiate a single measurement to compensate for manufacturing tolerances, or, in one embodiment, to start periodical measurements to compensate for varying operating conditions of the filter circuit 110. The circuit 100 may also comprise a power-down circuit (not shown) to shut down the tuning circuit after completion of a measurement cycle to reduce power consumption of the circuit 100.

The backward counter 124 provides at the counter output 127 the count value $x_n$ corresponding to the pulse length of the pulse signal. The count value $x_n$, the initial count value $x_{max}$ and the time constant of the tuning circuit 120 to be measured are then related by the equation:

$$x_n t_{clk} = x_{max} t_{clk} - t_{RC},$$

with $$t_{clk} = \frac{1}{f_{clk}}, \quad (4)$$

where $f_{clk}$ is the clock frequency. Substituting $t_{RC}$ in the above equation returns for the counter value $x_n$ at the counter output 127:

$$x_n = x_{max} - f_{clk} K_R R_F K_C C_U \Delta\tau \quad (5)$$

The initial value $x_{max}$ of the backward counter 124 is obtained from the maximum variation $\Delta\tau_{max}$ of the time constant that can compensate for the maximum technology and/or operation drifts. As previously derived in equation (2), in this instance the number of additionally connected capacitors 116 of the array 113 may be zero. Accordingly, the backward counter 124 will then reach its minimal count value, which is in the present embodiment set to zero. The initial count value $x_{max}$ can thus be written as:

$$x_{max} = f_{clk} K_R K_C R_F C_U \Delta\tau_{max} \quad (6)$$

Thus, the relationship of the time constants of the filter circuit 100 and the tuning circuit 120 is represented by the initial count value $x_{max}$, since $x_{max}$ includes the unit capacitance $C_U$ and the filter resistance $R_F$ as well as the weighting factors $K_C$ and $K_R$ characterizing the tuning elements. As previously described, the weighting factors $K_C$ and $K_R$ are preferably integer values selected to improve the matching of the filter circuit 100 and the tuning circuit 120. The count value $x_n$ representing the time constant of the tuning circuit 120 may then be written as:

$$x_n = x_{max}\left(1 - \frac{\Delta\tau}{\Delta\tau_{max}}\right) \quad (7)$$

When $\Delta\sigma$ and $\Delta\tau_{max}$ are replaced by the corresponding expressions previously derived in equations (1) and (2), the count value $x_n$ is obtained by:

$$x_n = x_{max}\left(1 - \frac{n_0}{n_0 + n}\right) = x_{max}\frac{n}{n_0 + n} \quad (8)$$

Thus, the number n of capacitors 114 to be connected to the op-amp 111 to compensate for technology variations and drifts of the operating conditions, i.e., the digital code output to the switch 115, may be determined by the count value $x_n$ provided at the counter output 127 and the initial count value $x_{max}$ with which the backward counter 124 is started. As can be seen from the above description, the initial count value $x_{max}$ contains information relating the time constant of the filter circuit 100 to the time constant of the tuning circuit 120. Finally, the digital code n, i.e., the number of variably connected capacitors used for compensation, is obtained by rewriting the above equation (8):

$$n = \frac{x_n n_0}{x_{max} - x_n}, \quad (9)$$

where n is an integer number ranging from 0 to $2^N - 1$ with N as the number of "digits" of the array 113, in the present embodiment N=4.

The decoder 128 comprises in one embodiment a means (not shown) for implementing the above-derived function to convert the count value $x_n$ to the digital code n that is output to the switch 115 to re-configure the array 113. The means for implementing the conversion of $x_n$ to the digital code may comprise, in an illustrative embodiment, a look-up table stored in advance in a memory element (not shown) to obtain a fast and efficient conversion without the necessity of a complex circuitry. According to a particular embodiment, in calculating the digital code n to be stored in the look-up table the round function is used in generating the integer value for the digital code n to avoid a systematic shift of the digital code n. Alternatively, the non-integer part of the calculated numbers may be cut off.

Although the implementation of the conversion function in the decoder as a look-up table is described, in a further embodiment any other appropriate means, such as a logic circuit and the like, may also be employed.

Although the embodiments have been described with reference to a filter circuit including an integrator it is to be understood that the embodiments described herein are also applicable to any other type of active filter circuits, such as Bessel filters, Chebeychev filters, Butterworth filters and the like. Furthermore, the time constant of the filter circuit to be tuned may be adjusted by providing an array of resistors to compensate for variations. The filter circuit may additionally include one or more inductive elements rather than only resistors and capacitors, or the resistor or the capacitors are replaced by inductors. While the embodiments contemplated may be particularly useful when the active filter circuit and the tuning circuit are incorporated in an integrated circuit, they may also be applied to a separately provided filter circuit. In this case, linear elements of the active filter circuit may be used as the tuning elements of the tuning circuit.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the present invention.

What is claimed is:

1. A circuit including
   an active filter having a plurality of first linear electronic elements arranged as a switchable array and at least one second linear electronic element, the first linear electronic elements having an electrical characteristic represented by a first design value and the second linear electronic element having an electrical characteristic represented by a second design value, the first and second linear electronic elements substantially determining a time constant of the active filter, and a tuning circuit for outputting a digital code n to the array of first linear electronic elements to adjust the time constant of the active filter approximately to a predefined value, the tuning circuit comprising:

a first linear tuning element having an electrical characteristic represented by the first design value times a first predefined factor $K_C$;

a second linear tuning element having an electrical characteristic represented by the second design value times a second predefined factor $K_R$;

a signal generator configured to generate a signal indicative of a tuning time constant determined by the first and second linear tuning elements;

a backward counter having a reset input configured to reset the backward counter upon receipt of a reset signal to an initial value $x_{max}$ that includes a relationship of the time constant of the active filter circuit and the tuning time constant;

a clock input connected to receive a clock signal, an enable input connected to the signal generator to receive a signal for starting the counter with the initial value $x_{max}$ and stopping the counter in order to generate a count value $x_n$, and a counter output configured to provide the count value $x_n$; and a decoder configured to convert the count value $x_n$ into a digital code n for switching the array of first linear electronic elements.

2. The circuit of claim 1, wherein the relationship of the time constant of the active filter circuit and the tuning time constant is substantially proportional to $K_C$ and $K_R$.

3. The circuit of claim 1, wherein the digital code output by the decoder is determined on the basis of a ratio $x_n/(x_{max}-x_n)$.

4. The circuit of claim 1, wherein the first linear electronic elements are capacitors.

5. The circuit of claim 1, wherein the second linear electronic element is one of an inductor and a resistor.

6. The circuit of claim 1, wherein a predefined number of the first linear electronic elements are connected to represent the first design value.

7. The circuit of claim 1, further comprising one or more first linear electronic elements that are permanently connected.

8. The circuit of claim 1, wherein the decoder comprises a memory including a look-up table for storing different values of the digital code n.

9. The circuit of claim 8, wherein the values for the digital code n stored in the look-up table are calculated using the equation $n = x_n \, n_0/(x_{max}-x_n)$, wherein $n_0$ is the number of permanently connected first linear electronic elements in the switchable array.

10. The circuit of claim 9, wherein the values for the digital code n are obtained as integer numbers by using one of the round and clipping function.

11. The circuit of claim 1, wherein the first and second predefined factors are integer values.

12. The circuit of claim 1, further comprising a latch for storing the digital code n.

13. The circuit of claim 1, further comprising a power controller to power down the tuning circuit after creating the digital code n.

14. The circuit of claim 1, wherein the circuit is an integrated circuit.

15. The circuit of claim 1, further comprising a switching means for connecting at least one of the first linear electronic elements and the second linear electronic element as the first and second linear tuning elements, respectively, to the decoder.

16. The circuit of claim 1, wherein said signal comprises two subsequent pulses the rising edges of which define an interval indicative of said tuning time constant.

17. The circuit of claim 16, wherein said interval is substantially equal to the tuning time constant.

18. The circuit of claim 1, wherein said signal comprises a pulse whose pulse length is indicative of the tuning time constant.

19. A circuit including an active filter having a plurality of first linear electronic elements at least some of which are arranged as a switchable array and a second linear electronic element, each of the first linear electronic elements corresponding to a first design value and the second linear electronic element corresponding to a second design value, the first and second linear electronic elements substantially determining a time constant of the active filter, a first linear tuning element having an electrical characteristic determined by the first design value;

a second linear tuning element having an electrical characteristic determined by the second design value; the first and second tuning element defining a tuning time constant;

means for generating a signal indicative of the tuning time constant; means for providing an output count value on the basis of an initial count value representing a relationship between the time constant and the tuning time constant; and means for providing a digital code to the switchable array on the basis of the output count value in order to adjust the time constant.

20. The circuit of claim 19, wherein the electrical characteristic of the first linear tuning element is substantially proportional to the first design value.

21. The circuit of claim 19, wherein the electrical characteristic of the second linear tuning element is substantially proportional to the second design value.

22. The circuit of claim 19, wherein the signal comprises two subsequent pulses the rising edges of which define an interval indicative of said tuning time constant.

23. A method of tuning an active filter, the active filter comprising a plurality of first linear electronic elements at least some of which are arranged as a switchable array, and a second linear electronic element, each of the first linear electronic elements corresponding to a first design value and the second linear electronic element corresponding to a second design value, the first and second linear electronic elements substantially determining a time constant of the active filter, the method comprising:

generating a signal indicative of a tuning time constant defined by a first linear tuning element and a second linear tuning element, wherein an electrical characteristic of the first linear tuning element is determined by the first design value, and an electrical characteristic of the second linear tuning element is determined by the second design value;

starting and stopping, on the basis of said signal, a counter operated at a clock frequency to generate a count value, wherein an initial count value of the counter is determined by the time constant and the tuning time constant.

24. The method of claim 23, wherein generating said signal includes producing two subsequent pulse signals defining a time interval that determines the tuning time constant.

25. The method of claim 24, wherein said time interval is determined by rising edges of said two subsequent pulse signals.

26. The method of claim 23, wherein said initial count value is proportional to the first design value, the second design value, the clock frequency and a predefined maximum variation of the time constant.

27. The method of claim 23, further comprising converting said count value in a digital code, and providing the digital code to means for selectively connecting one or more of the first linear electronic elements to readjust the time constant.

28. The method of claim 27, wherein said digital code is provided as an integer number.

29. The method of claim 27, wherein values of said digital code are stored in advance in a memory.

30. The method of claim 28, wherein said digital code is computed by using one of a round function and a clipping function.

* * * * *